United States Patent
Terao

(10) Patent No.: US 11,973,157 B2
(45) Date of Patent: Apr. 30, 2024

(54) METALLIZATION AND STRINGING FOR BACK-CONTACT SOLAR CELLS

(71) Applicant: Maxeon Solar Pte. Ltd., Singapore (SG)

(72) Inventor: Akira Terao, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 17/980,440

(22) Filed: Nov. 3, 2022

(65) Prior Publication Data

US 2023/0055900 A1 Feb. 23, 2023

Related U.S. Application Data

(62) Division of application No. 14/752,750, filed on Jun. 26, 2015, now abandoned.

(51) Int. Cl.
*H01L 31/05* (2014.01)
*H01L 31/0224* (2006.01)

(52) U.S. Cl.
CPC .. *H01L 31/0504* (2013.01); *H01L 31/022441* (2013.01); *Y02E 10/50* (2013.01)

(58) Field of Classification Search
CPC ......... H01L 31/0504; H01L 31/022441; H01L 31/188; H01L 31/022425; H01L 31/022433; H01L 31/0682; H01L 31/1876
See application file for complete search history.

(56) References Cited

U.S. PATENT DOCUMENTS

| | | | |
|---|---|---|---|
| 3,006,067 | A | 10/1961 | Anderson et al. |
| 4,380,112 | A | 4/1983 | Little |
| 8,766,090 | B2 | 7/2014 | Sewell et al. |
| 9,640,710 | B2 | 5/2017 | Pearce et al. |
| 2008/0216887 | A1 | 9/2008 | Hacke et al. |
| 2009/0126788 | A1 | 5/2009 | Hishida et al. |
| 2009/0272419 | A1 | 11/2009 | Sakamoto et al. |
| 2010/0200058 | A1 | 8/2010 | Funakoshi |
| 2011/0073165 | A1 | 3/2011 | Lee |

(Continued)

FOREIGN PATENT DOCUMENTS

| CN | 102365755 | 2/2012 |
|---|---|---|
| CN | 102576756 | 7/2012 |

(Continued)

OTHER PUBLICATIONS

WO 2010/057674A2 English machine translation (Year: 2010).*

(Continued)

*Primary Examiner* — Andrew J Golden
(74) *Attorney, Agent, or Firm* — Schwabe, Williamson & Wyatt, P.C.

(57) ABSTRACT

Metallization and stringing methods for back-contact solar cells, and resulting solar cells, are described. In an example, in one embodiment, a method involves aligning conductive wires over the back sides of adjacent solar cells, wherein the wires are aligned substantially parallel to P-type and N-type doped diffusion regions of the solar cells. The method involves bonding the wires to the back side of each of the solar cells over the P-type and N-type doped diffusion regions. The method further includes cutting every other one of the wires between each adjacent pair of the solar cells.

8 Claims, 14 Drawing Sheets

(56) References Cited

U.S. PATENT DOCUMENTS

| | | |
|---|---|---|
| 2011/0290298 A1 | 12/2011 | Krause et al. |
| 2012/0037203 A1 | 2/2012 | Sainoo et al. |
| 2012/0204938 A1 | 8/2012 | Hacke et al. |
| 2012/0279546 A1 | 11/2012 | Kutzer et al. |
| 2013/0081674 A1 | 4/2013 | Joe et al. |
| 2013/0160825 A1 | 6/2013 | Lantzer et al. |
| 2013/0340804 A1 | 12/2013 | Moon et al. |
| 2015/0090329 A1 | 4/2015 | Pass |
| 2017/0222082 A1 | 8/2017 | Lin et al. |

FOREIGN PATENT DOCUMENTS

| | | |
|---|---|---|
| CN | 102694037 | 9/2012 |
| CN | 103515360 | 1/2014 |
| DE | 102007035883 | 2/2009 |
| DE | 102011081674 | 2/2013 |
| EP | 2577740 | 4/2013 |
| JP | 2003/298095 | 10/2003 |
| JP | 2013/077821 | 4/2013 |
| JP | 2014-140062 | 7/2014 |
| KR | 10-2011-0034183 | 4/2011 |
| KR | 2013/0034867 | 4/2013 |
| TW | 2014/45749 | 12/2014 |
| WO | WO 2010/057674 | 5/2010 |
| WO | WO 2011/011855 | 2/2011 |
| WO | WO 2014/117216 | 8/2014 |
| WO | WO 2014/163491 | 10/2014 |
| WO | WO 2016/109909 | 7/2016 |

OTHER PUBLICATIONS

JP 2003298095A English machine translation (Year: 2003).*
Gress, et al., "Wire bonding as a cell interconnection technique for polycrystalline silicon thin-film solar cells on glass," Progress in Photovoltaics: Research and Applications, Mar. 11, 2010, pp. 221-228, vol. 18.
First Action Interview Pre-Interview Communication from U.S. Appl. No. 14/752,750 dated Sep. 6, 2016, 6 pgs.
International Search Report and Written Opinion for PCT Patent Application No. PCT/US16/39103 dated Sep. 29, 2016, 13 pgs.
First Action Interview Office Action from U.S. Appl. No. 14/752,750 dated Feb. 24, 2017, 8 pgs.
Final Office Action from U.S. Appl. No. 14/752,750 dated Jun. 29, 2017, 16 pgs.
Non-Final Office Action from U.S. Appl. No. 14/752,750 dated Dec. 11, 2017, 12 pgs.
International Preliminary Report on Patentability from PCT/US2016/039103 dated Jan. 4, 2018, 10 pgs.
Final Office Action from U.S. Appl. No. 14/752,750 dated Apr. 13, 2018, 25 pgs.
Office Action from Taiwanese Patent Office for Taiwan Patent Application No. 105120004 dated Jun. 15, 2018, 5 pgs.
Non-Final Office Action from U.S. Appl. No. 14/752,750 dated Dec. 13, 2018, 18 pgs.
Final Office Action from U.S. Appl. No. 14/752,750 dated Jul. 25, 2019, 16 pgs.
Non-Final Office Action from U.S. Appl. No. 14/752,750 dated Mar. 5, 2020, 21 pgs.
Non-Final Office Action from U.S. Appl. No. 14/752,750 dated May 12, 2021, 24 pgs.
Non-Final Office Action from U.S. Appl. No. 14/752,750 dated Mar. 17, 2022, 21 pgs.
First Office Action from Chinese Patent Application No. 2016800412102 dated Apr. 3, 2020, 12 pgs.
First Report from German Patent Application No. 112016002849 dated Aug. 17, 2020, 17 pgs.
Final Office Action from U.S. Appl. No. 14/752,750 dated Nov. 12, 2020, 22 pgs.
Second Office Action from Chinese Patent Application No. 2016800412102 dated Dec. 31, 2020, 12 pgs.
Third Office Action from Chinese Patent Application No. 2016800412102 dated Apr. 22, 2021, 9 pgs.
Final Office Action from U.S. Appl. No. 14/752,750 dated Oct. 25, 2021, 20 pgs.
Report of Re-examination Notice from Chinese Patent Application No. 2016800412102 dated Apr. 26, 2022, 11 pgs.
Report on the Examination Decision from Chinese Patent Application No. 2016800412102 dated Jun. 22, 2022, 15 pgs.
Final Office Action from U.S. Appl. No. 14/752,750 dated Aug. 4, 2022, 27 pgs.
Notification of Provisional Rejection from Korean Patent Application No. 10-2018-7002114 dated Apr. 26, 2023, 7 pgs.
Notice of Refusal from Korean Patent Application No. 10-2018-7002114 dated Sep. 1, 2023, 6 pgs.

* cited by examiner

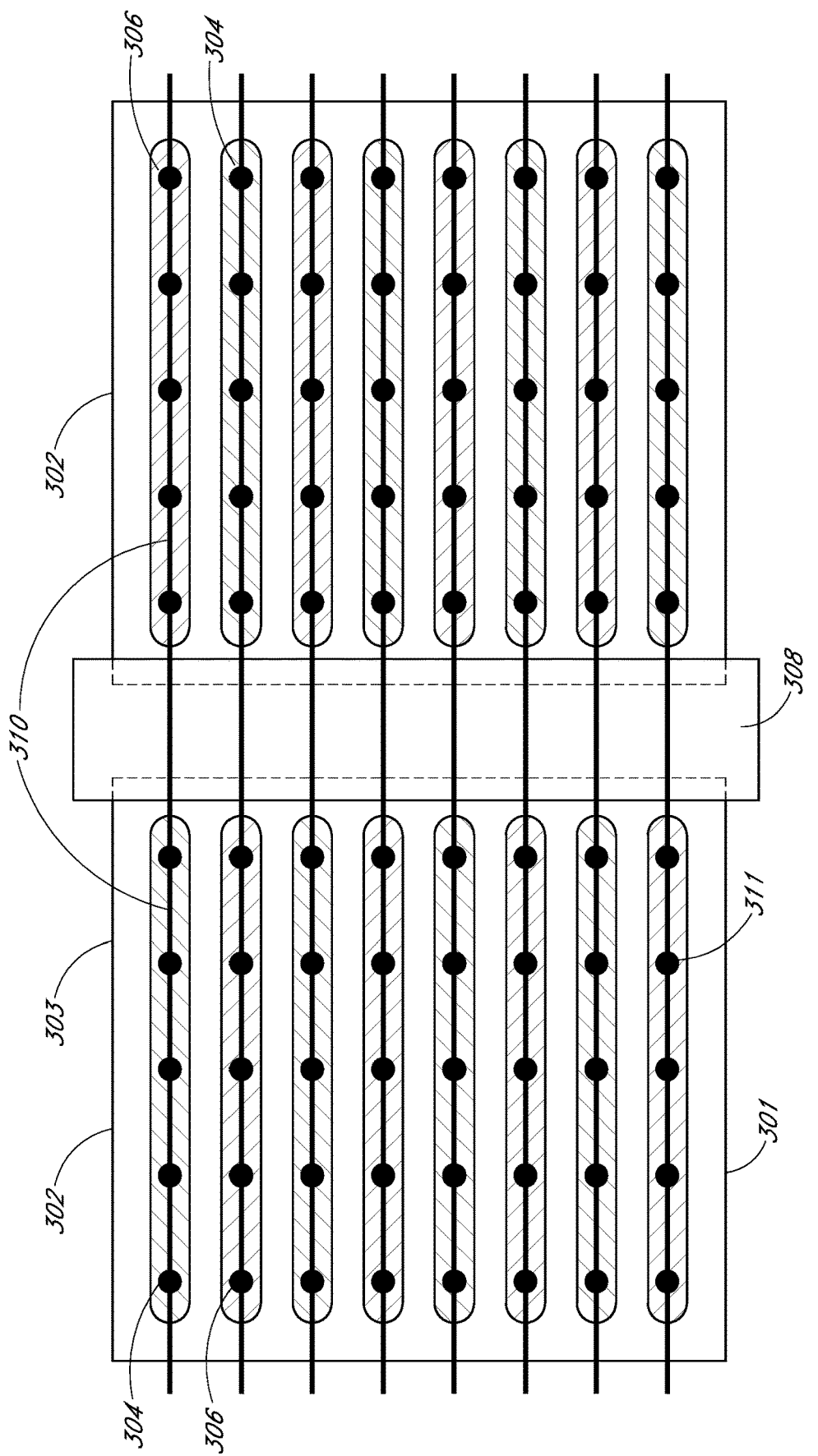

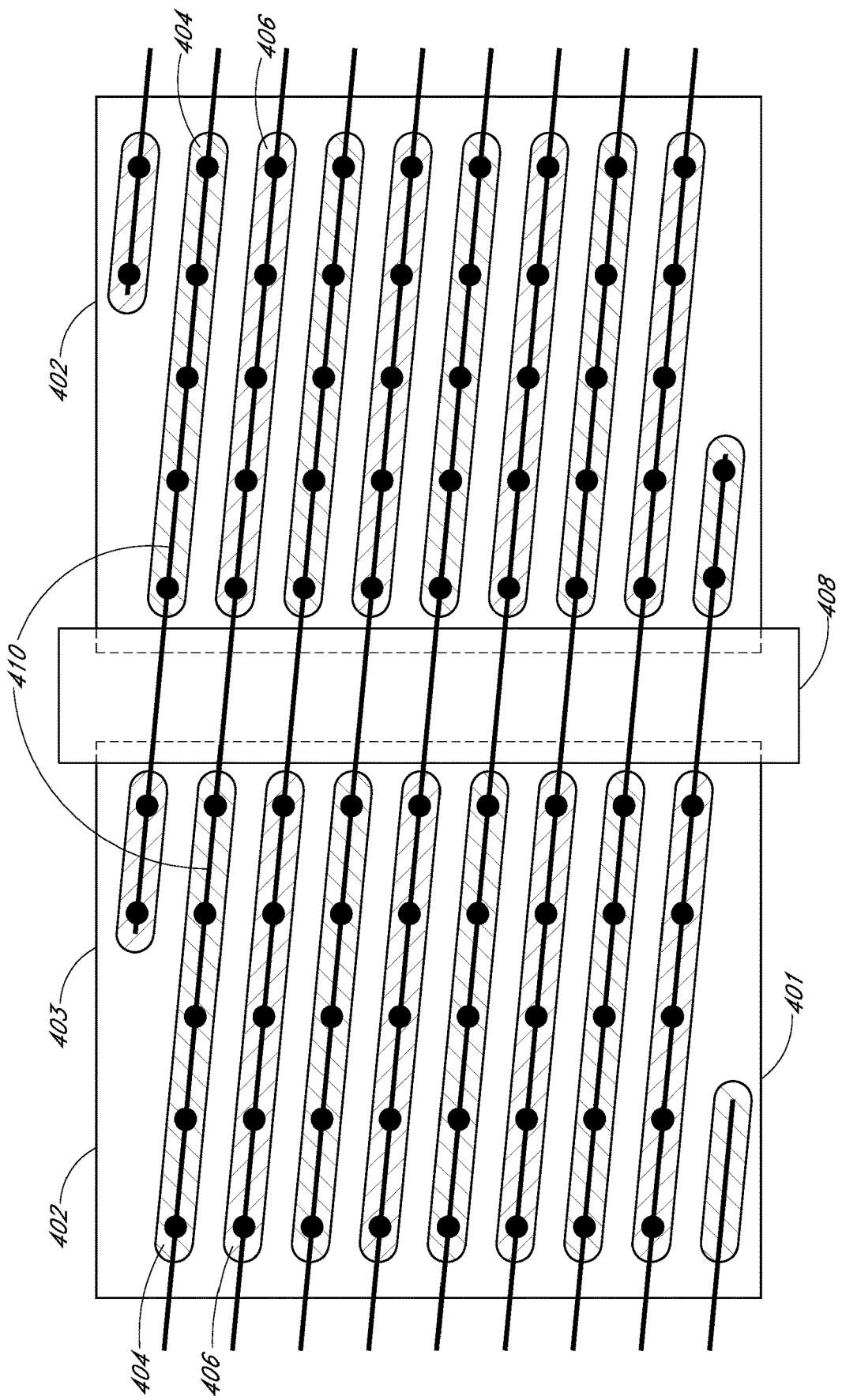

METALLIZATION AND STRINGING FOR BACK-CONTACT SOLAR CELLS

CROSS-REFERENCE TO RELATED APPLICATIONS

This application is a Divisional of U.S. patent application Ser. No. 14/752,750, filed on Jun. 26, 2015, the entire contents of which are hereby incorporated by reference herein.

STATEMENT REGARDING FEDERALLY SPONSORED RESEARCH OR DEVELOPMENT

The invention was made with government support under DE-EE0008175 awarded by the U.S. Department of Energy. The government has certain rights in the invention.

TECHNICAL FIELD

Embodiments of the present disclosure are in the field of renewable energy and, in particular, include metallization and stringing techniques for back-contact solar cells, and the resulting solar cells and modules.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 3A-3E and 4A-4E illustrate views of various stages in a metallization and stringing method for back-contact solar cells, corresponding to the operations in the method of FIG. 2, in accordance with an embodiment of the present disclosure, wherein:

FIG. 3A illustrates a back-side view of adjacent solar cells that are to be stringed together, the solar cells including alternating P-type and N-type doped diffusion regions that are substantially parallel to an edge of the solar cells;

FIG. 3B illustrates a back-side view of the adjacent solar cells of FIG. 3A following attachment of a non-conductive shield to the back sides of the adjacent solar cells;

FIG. 3C illustrates a back-side view of the adjacent solar cells of FIG. 3B following alignment of conductive wires over the back sides of the adjacent solar cells, wherein the wires are aligned substantially parallel to the P-type and N-type doped diffusion regions of the solar cells;

FIG. 3D illustrates a back-side view of the adjacent solar cells of FIG. 3C following bonding of the conductive wires to the back sides of adjacent solar cells;

FIG. 3E illustrates a back-side view of the adjacent solar cells of FIG. 3D following the cutting of every other one of the wires between each adjacent pair of the solar cells;

FIG. 4A illustrates a back-side view of adjacent solar cells that are to be stringed together, the adjacent solar cells including alternating P-type and N-type doped diffusion regions that are at a non-zero angle relative to the edges of the solar cells;

FIG. 4B illustrates a back-side view of the adjacent solar cells of FIG. 4A following attachment of a non-conductive shield to the back sides of the adjacent solar cells;

FIG. 4C illustrates a back-side view of the adjacent solar cells of FIG. 4B following alignment of conductive wires over the back sides of adjacent solar cells, wherein the wires are aligned substantially parallel to P-type and N-type doped diffusion regions of the solar cells;

FIG. 4D illustrates a back-side view of the adjacent solar cells of FIG. 4C following bonding of the conductive wires to the back sides of the adjacent solar cells; and FIG. 4E illustrates a back-side view of the adjacent solar cells of FIG. 4D following the cutting of every other one of the wires between each adjacent pair of the solar cells.

DETAILED DESCRIPTION

Figure 1A:
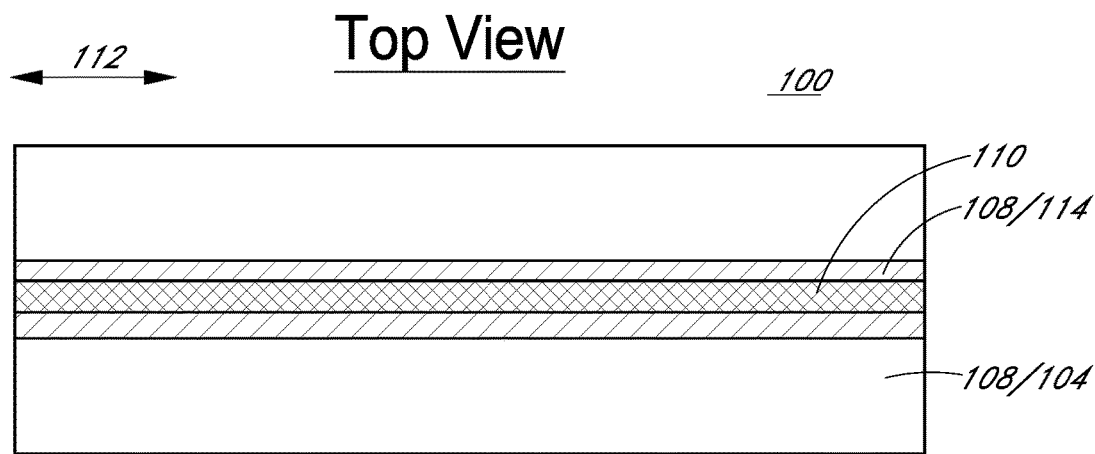
FIG. 1A illustrates a plan view of the back side of a solar cell having wire-based metallization, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Metallization and stringing methods for back-contact solar cells, and the resulting solar cells and modules, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are strings of solar cells. In one embodiment, a string of solar cells includes a plurality of back-contact solar cells. Each of the plurality of back-contact solar cells includes alternating P-type and N-type doped diffusion regions. A plurality of conductive wires is disposed over a back surface of each of the plurality of solar cells, wherein each of the plurality of wires is substantially parallel to the P-type and N-type doped diffusion regions of each of the plurality of solar cells. Every other one of the plurality of wires is cut in a region between each adjacent pair of the plurality of solar cells.

In one embodiment, a string of solar cells includes a plurality of back-contact solar cells, wherein each of the plurality of back-contact solar cells includes alternating P-type and N-type doped diffusion regions. The plurality of back-contact solar cells includes end solar cells and inner solar cells between the end solar cells. One of the P-type diffusion regions of each of the inner solar cell is located opposite one of the N-type diffusions of an adjacent solar cell along a line parallel to the P-type and N-type regions. The string of solar cells also includes a plurality of conductive wires disposed over a back surface of each of the plurality of solar cells. Each of the plurality of wires is substantially parallel to the P-type and N-type doped diffusion regions of each of the plurality of solar cells. Every other one of the plurality of wires is cut in a region between each adjacent pair of the plurality of solar cells.

Also disclosed herein are methods of fabricating strings of solar cells. In one embodiment a method of electrically coupling solar cells involves aligning conductive wires over the back sides of adjacent solar cells. The wires are aligned substantially parallel to P-type and N-type doped diffusion regions of the solar cells. The method involves bonding the wires to the back side of each of the solar cells over the P-type and N-type doped diffusion regions. The method further involves cutting every other one of the wires between each adjacent pair of the solar cells.

Also disclosed herein are systems for electrically coupling solar cells. In one embodiment, a system includes a wire support to align conductive wires substantially parallel with P-type and N-type doped diffusion regions of each of the solar cells. The system also includes a welder to bond the wires to the back side of each of the solar cells over the P-type and N-type doped diffusion regions. The system also includes a cutter to sever every other one of the wires between each adjacent pair of the solar cells.

Thus, one or more embodiments described herein are directed to metallization and stringing techniques. According to embodiments, wires may be used to string back-contact solar cells together instead of patterned cell interconnects. The wires can also serve as metallization to collect current across the cells, either by themselves, or in conjunction with a first level metallization on the solar cells.

To provide context, techniques for stringing together back-contact solar cells can be different than techniques for stringing together front-contact cells. In an example, for back-contact cells, metal fingers for each polarity (N and P) can be connected to a single busbar at the edge of the cell. Cell interconnects can then be soldered from the "P busbar" (e.g., the busbar connected to the metal finger for a given P-type region) of one cell to the "N busbar" (e.g., the busbar connected to the metal finger for a given N-type region) of the next solar cell.

The space used by such busbars on the solar cells reduces the overall efficiency of the solar cells. Furthermore, the process of forming the metal fingers and the busbars on the cell can be costly. Stringing together front-contact solar cells (in contrast to embodiments described herein, which include methods for stringing together back-contact solar cells) may involve the use of metal ribbons weaving from the back side of one cell to the front side of the next cell. In other words, between two front contact cells, a ribbon can go underneath one cell and across the top of another adjacent cell (e.g., the next cell). Weaving from front to back for front-contact cells can pose manufacturing difficulties (e.g., alignment difficulties, etc.).

According to embodiments, instead of using busbars to collect the current throughout each cell, each finger (e.g., P-type doped diffusion regions or N-type doped diffusion regions) of one cell is directly connected to the corresponding finger (e.g., a finger of opposite polarity) of the next cell using continuous conductive wires. The ribbons are first attached across some or all cells of the entire string (e.g., in a continuous string), shorting each pair of solar cells. Every other wire is subsequently cut between cells in order to restore separate P and N electrodes. For example, P and N electrodes are separate but connected back and forth if every other wire is not cut. Every other wire connects the P electrodes of a first cell to the N electrodes of a second cell. The other wires connect the N electrodes of the first cell to the P electrodes of the second cell. The pair of cells is therefore shorted if one of the two sets of wires is not cut. Therefore, cutting one of the two sets of wires between a given pair of cells can restore separate P and N electrodes.

Figure 1B:
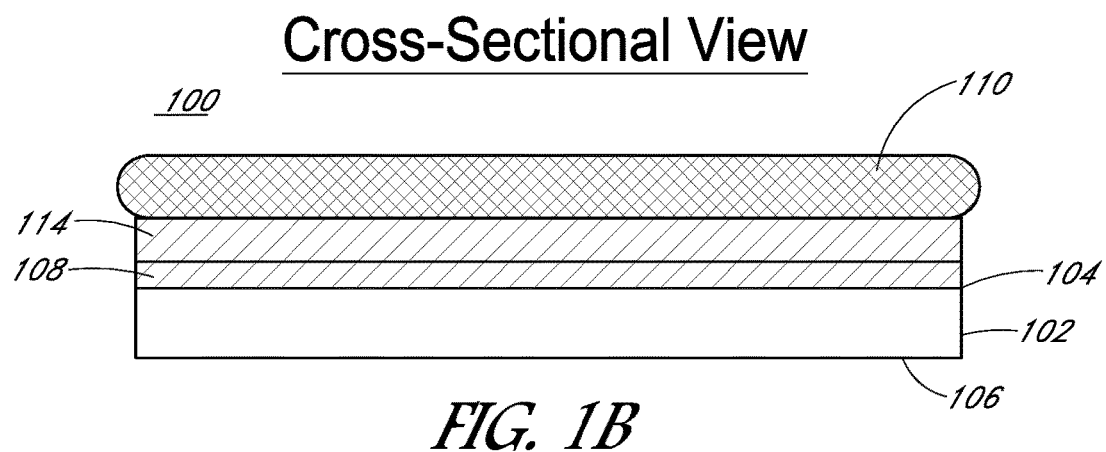
FIG. 1B illustrates a cross-sectional view corresponding to the solar cell of FIG. 1A.

For example, FIGS. 1A and 1B illustrate a plan view of the back side of a solar cell having wire-based metallization, and a corresponding cross-sectional view, in accordance with an embodiment of the present disclosure.

Referring to FIGS. 1A and 1B, a portion 100 of a solar cell includes a substrate 102 having a back surface 104 and an opposing light-receiving surface 106. A plurality of alternating N-type and P-type semiconductor regions (one such regions shown as 108) is disposed in or above the back surface 104 of the substrate 102. A conductive contact structure is disposed on the plurality of alternating N-type and P-type semiconductor regions 108. The conductive contact structure includes a plurality of conductive wires (one conductive wire shown as 110). Each conductive wire 110 is bonded to the solar cell at bonding points. Each conductive wire 110 of the plurality of conductive wires is parallel along a first direction 112 to form a one-dimensional layout of a metallization layer for the portion 100 of a solar cell, examples of which are described in greater detail below in association with FIGS. 3A-3E and 4A-4E.

In an embodiment, as is depicted in FIGS. 1A and 1B, the conductive contact structure further includes a metal seed layer 114 (e.g., an M1 layer) disposed between the plurality of alternating N-type and P-type semiconductor regions 108 and the plurality of conductive wires 110. In some embodiment including a metal seed layer 114, the conductive wires may be soldered or welded (e.g., with a laser) to the metal seed layer 114, as is described in more detail below with respect to FIGS. 3D and 4D.

Figure 2:
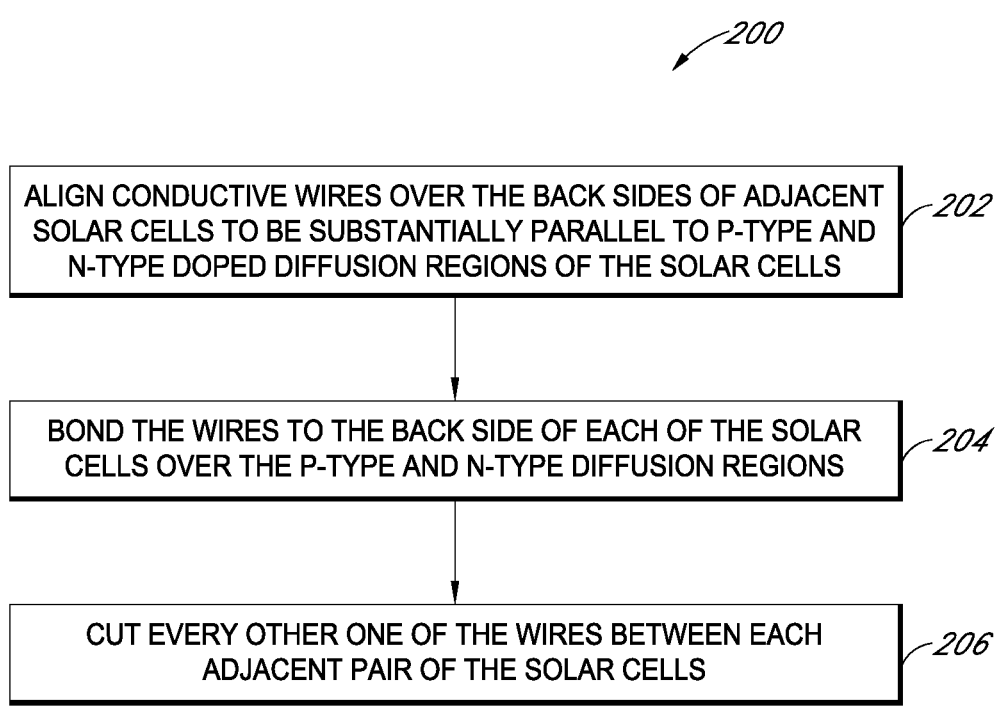
FIG. 2 is a flowchart listing operations in a method of metallization and stringing for back-contact solar cells, in accordance with an embodiment of the present disclosure.

In an exemplary process flow, FIG. 2 is a flowchart listing operations in a method of metallization and stringing for back-contact solar cells, in accordance with an embodiment of the present disclosure. FIGS. 3A-3E and 4A-4E illustrate views of various stages in a metallization and stringing method for back-contact solar cells, corresponding to the operations in the method of FIG. 2, in accordance with an embodiment of the present disclosure.

Figure 3A:
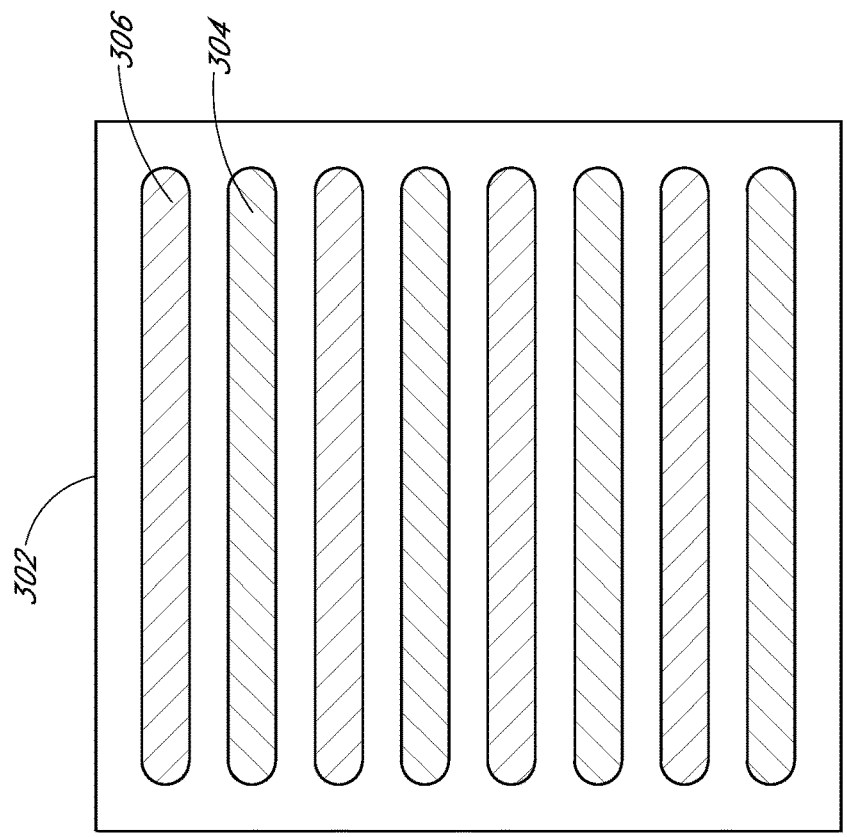
Figure 3A:
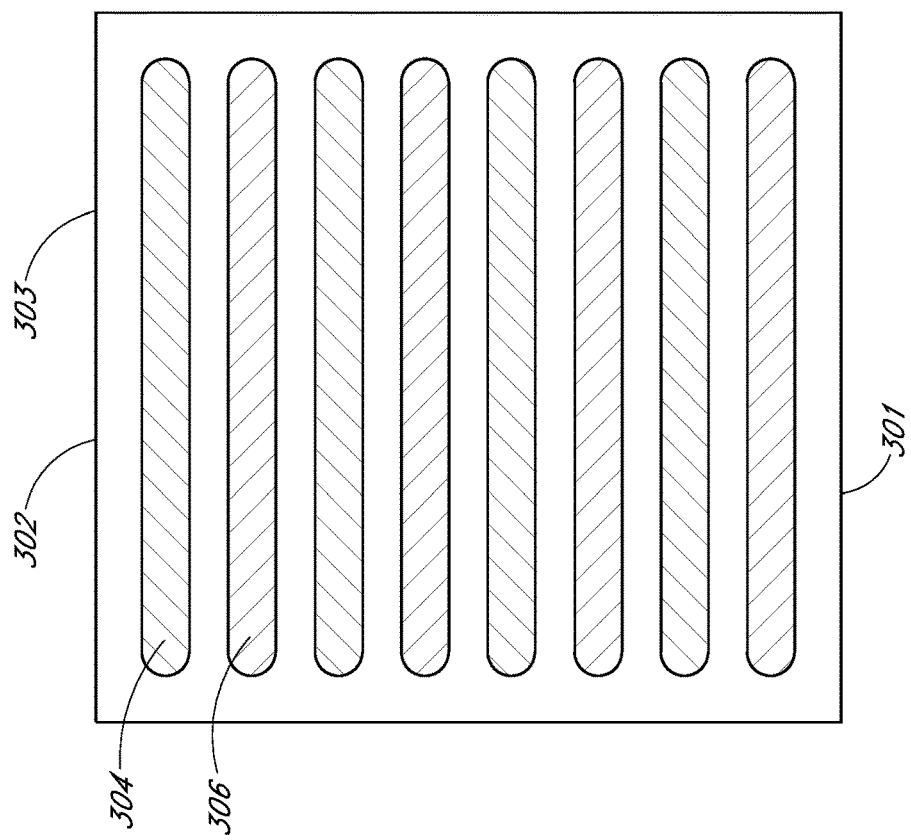

FIG. 3A illustrates a back-side view of adjacent solar cells 302 that are to be stringed together, including alternating P-type doped diffusion regions 304 and N-type doped diffusion regions 306. In one such embodiment, each of the plurality of solar cells 302 is substantially rectangular, and the P-type doped diffusion regions 304 and the N-type doped diffusion regions 306 are substantially parallel to the edges 301, 303 of the solar cells 302. A solar cell that is substantially rectangular could be, for example, a square, or another rectangular shape, and may have standard, cut, or rounded corners. As illustrated in FIG. 3A, the solar cells 302 are asymmetric in the sense that the solar cells 302 end with a P finger on one side (e.g., side 303) and an N finger on the opposite side (e.g., side 301). The asymmetric solar cells can then be placed in alternating orientations along the string, as illustrated in FIG. 3A. The asymmetric solar cell design together with the alternating orientations along the string enable the use of wires that are parallel to the edges 301, 303 of the solar cells because the P finger on one of the solar cells is directly across from the N finger of the adjacent solar cell, as is explained below with respect to FIG. 3C.

Figure 4A:
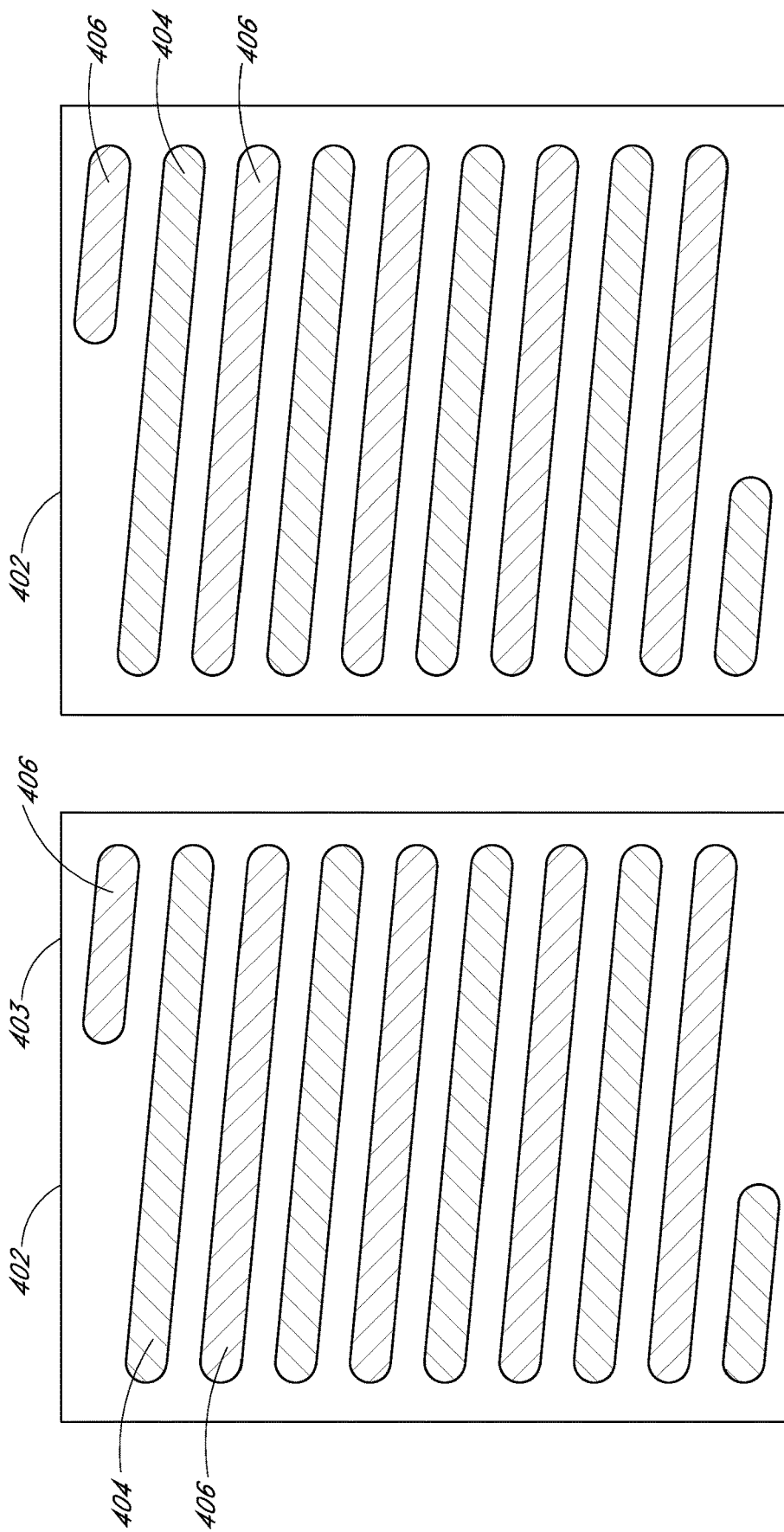

In another embodiment, an oblique finger design is used, as illustrated in FIG. 4A. FIG. 4A also illustrates a back-side view of adjacent solar cells 402 that are to be stringed together, including alternating P-type doped diffusion regions 404 and N-type doped diffusion regions 406. However, in contrast to FIG. 3A, the alternating P-type doped diffusion regions 404 and N-type doped diffusion regions 406 are at a non-zero angle relative to the edges 403 of the substantially rectangular solar cells 402. Thus, in one embodiment, the P-type doped diffusion regions 404 and N-type doped diffusion regions 406 are actually formed at a non-zero angle in or over the substrate. In one embodiment, the alternating P-type doped diffusion regions 404 and N-type doped diffusion regions 406 are at an angle in a range of 1 to 25 degrees relative to the edges 401, 403 of each of the plurality of solar cells. In one such embodiment, the alternating P-type doped diffusion regions 404 and N-type doped diffusion regions 406 are at an angle in the range of 1 to 5 degrees relative to edges of each of the plurality of solar cells.

According to one embodiment, in an oblique finger design, each of the solar cells 402 can have the same configuration and number of alternating P-type doped diffusion regions 404 and N-type doped diffusion regions 406. Therefore, the solar cells 402 are placed having the same alignment in a string (e.g., not the alternating orientation described with respect to FIG. 3A). However, with an oblique finger design, the management of wires may be more complex than with the parallel finger design.

Figure 3B:
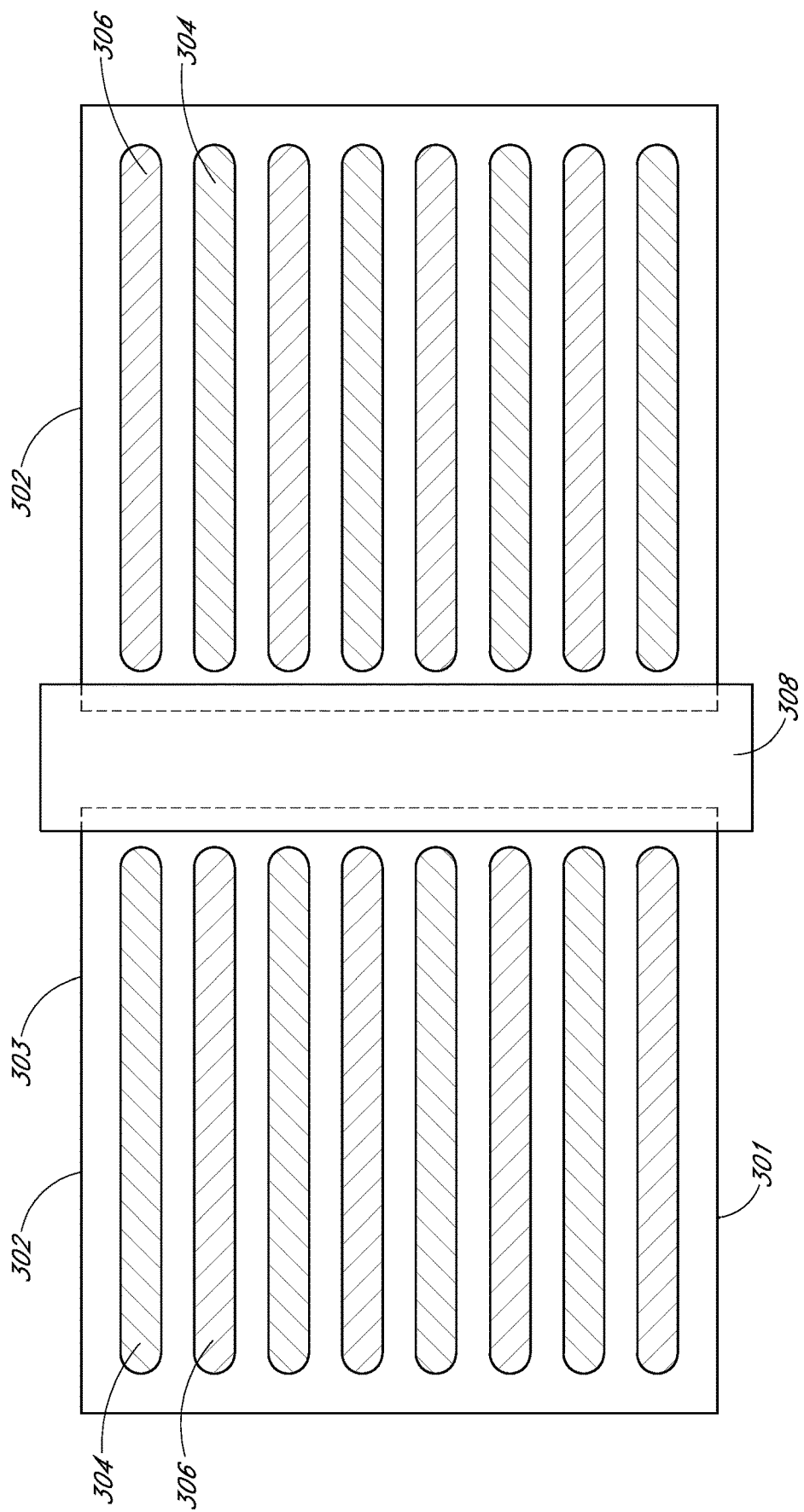
Figure 4B:
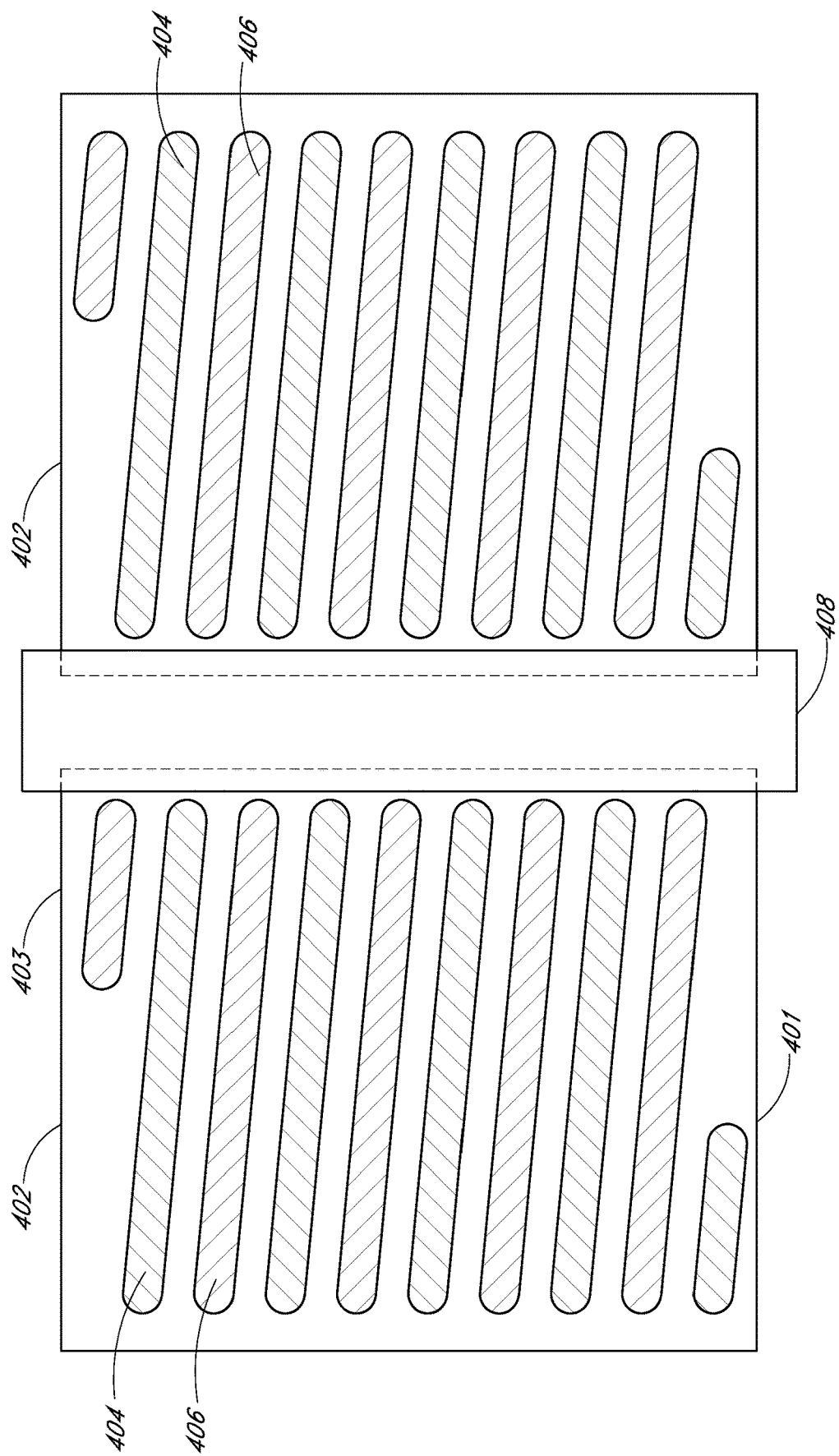
Figure 4C:
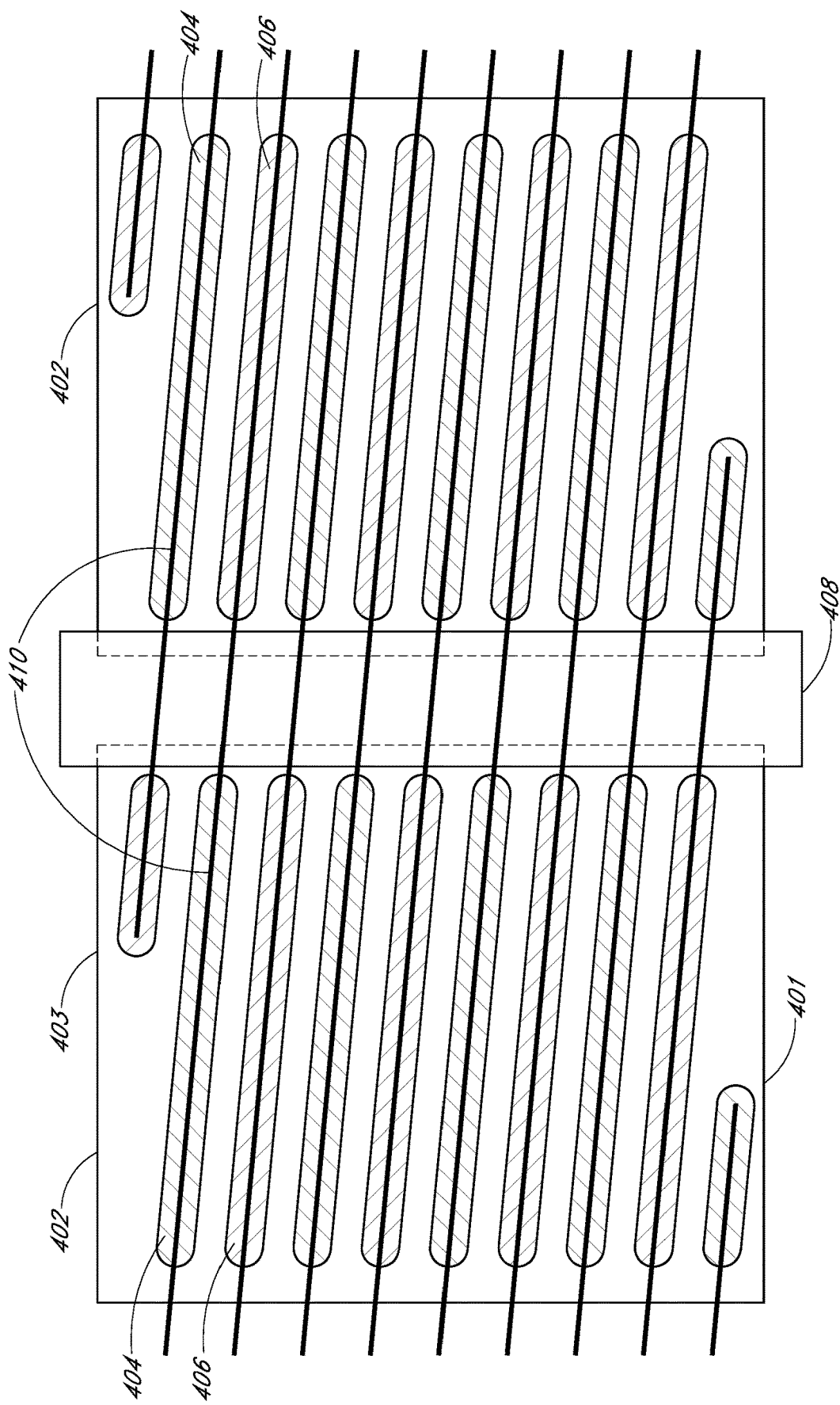

Referring to FIG. 3B and corresponding operation 202 of flowchart 200, a method of metallization and stringing includes attaching a non-conductive shield 308 to the back sides of the adjacent solar cells 302. Similarly, FIG. 4B illustrates a back-side view of the adjacent solar cells 402 of FIG. 4A following attachment of a non-conductive shield 408 to the back sides of the adjacent solar cells 402. The non-conductive shield 308 may be a non-conductive tape or other suitable non-conductive shield or cover. The non-conductive shield may serve to hide the ribbons when viewed from the front. Thus, the non-conductive shield covers exposed sections of the wires between each adjacent pair of the plurality of solar cells. Therefore, according to embodiments, the non-conductive shield includes a material that is substantially opaque to sufficiently cloak the wires when viewed from the front. The non-conductive shield may also assist in alignment of the solar cells, and/or holding the solar cells 302 together. The non-conductive shield 308 may include materials such as polypropylene or polyethylene, and can further include an adhesive layer like an acrylate. A non-conductive shield with an adhesive layer can be beneficial to assist in alignment. The non-conductive shield 408 may be similar to, or the same as, the non-conductive shield 308. Although a non-conductive shield may be beneficial for the reasons explained above, other embodiments may not include a non-conductive shield.

Figure 3C:
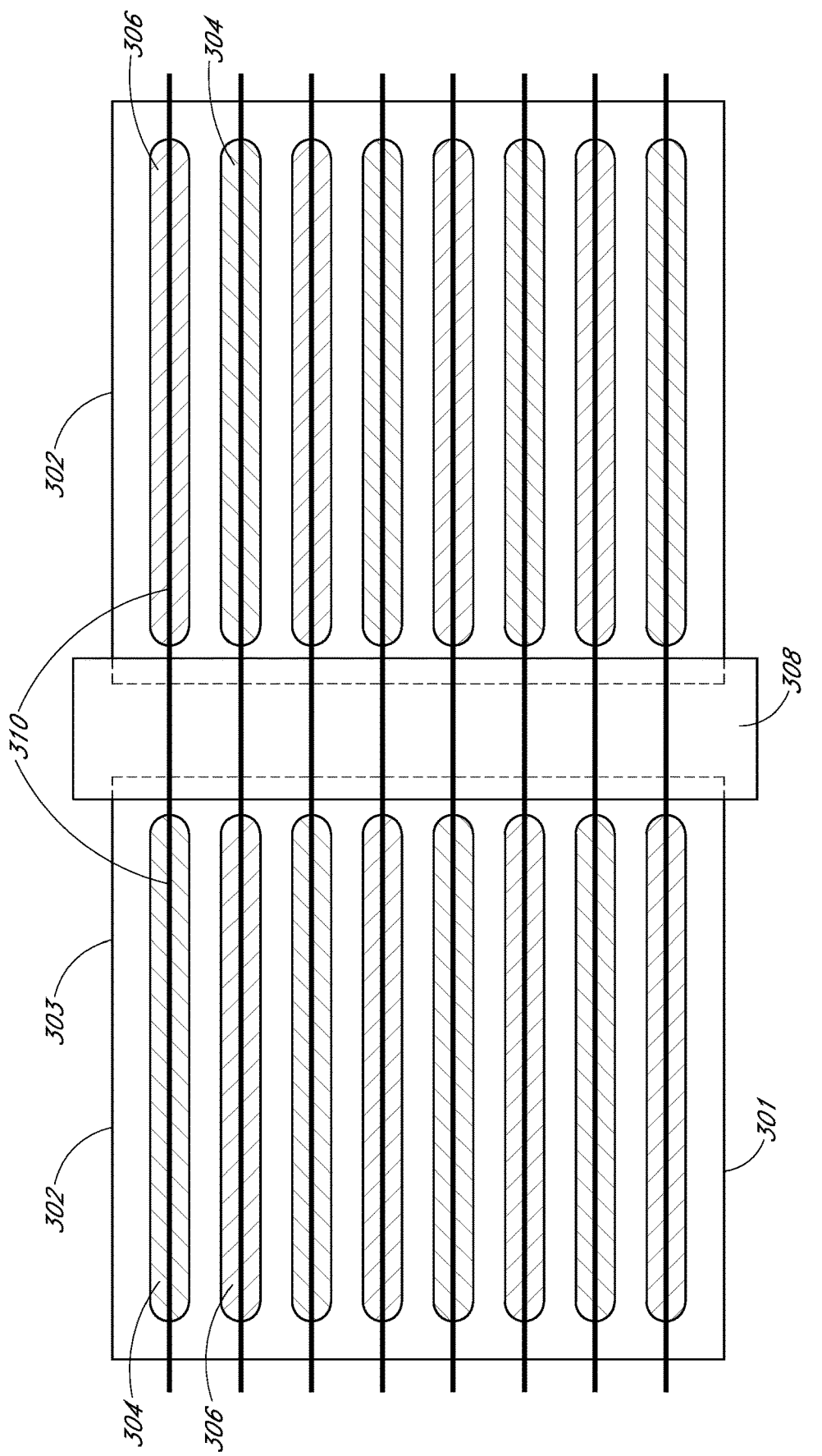

Referring to FIG. 3C and corresponding operation 204 of the flowchart 200, the method of metallization and stringing includes aligning conductive wires 310 over the back sides of adjacent solar cells 302. In one embodiment, the wires 310 are aligned substantially parallel to the P-type doped diffusion regions 304 and N-type doped diffusion regions 306 of the solar cells 302. The wires 310 can have a cross-sectional shape that is round, flattened (e.g., ribbons), slightly flattened, or another shape. Round wires may be beneficial because they can be rolled or twisted. In an embodiment involving the alignment and placement of round wires, the wires can be flattened prior to or during bonding the wires to the back side of each of the solar cells.

Conductive wires include an electrically conducting material (e.g., a metal such as copper, aluminum, or another suitable conductive material, with or without a coating such as tin, silver, nickel or an organic solderability protectant). In the embodiment illustrated in FIG. 3C, the number of wires is equal to (or approximately equal to) the number of diffusion regions of each of the plurality of solar cells. In one such embodiment, a single wire is aligned over each of the P-type doped diffusion regions 304 and N-type doped diffusion regions 306 of the solar cells 302. According to one embodiment, each of the wires 310 is roughly centered over one of the P-type doped diffusion regions 304 and N-type doped diffusion regions 306 of the solar cells 302

As illustrated in FIG. 3C, the wires 310 can be aligned so that they are substantially parallel to the edges 301, 303 of the plurality of solar cells 302. In an embodiment where the P-type and N-type doped diffusion regions are not parallel to the edges of the solar cells, such as in FIG. 4C, the wires 410 would also not be aligned parallel to the edges 401, 403 of the solar cells 402. For example, if the P-type doped diffusion regions 404 and the N-type doped diffusion regions 406 are disposed at an angle in the range of 1 to 25 degrees, the wires would be aligned parallel with the P-type doped diffusion regions 404 and the N-type doped diffusion regions 406, and thus would also be disposed at an angle in a range of 1 to 25 degrees relative to edges 401, 403 of each of the plurality of solar cells 402.

Turning again to FIG. 3C, the wires can be aligned via a variety of mechanisms. For example, in one embodiment, aligning the conductive wires 310 over the back sides of adjacent solar cells 302 involves use of a grooved roller (such as the grooved roller 602 depicted in FIG. 6, which is described in further detail below). Other mechanisms may be used to align the conductive wires 310 over the P-type doped diffusion regions 304 and N-type doped diffusion regions 306 of the solar cells 302 instead of, or in addition to, a grooved roller. For example, according to one embodiment, a reed, or other mechanism suitable for aligning and guiding the conductive wires may be used. When aligning wires over a solar cell that is not the first solar cell, the fact that the wires are bonded to the first solar cell can assist in alignment of the wires over the subsequent solar cells, in accordance with an embodiment.

After aligning the conductive wires 310, the method illustrated in FIG. 2 involves bonding the conductive wires to the back side of the solar cells 302 the P-type doped diffusion regions 304 and N-type doped diffusion regions 306 of the solar cells 302, at operation 204. FIG. 3D illustrates a back-side view of the adjacent solar cells 302 of FIG. 3C following bonding of the conductive wires 310 to the back sides of the adjacent solar cells 302. Similarly, FIG. 4D illustrates a back-side view of the adjacent solar cells 402 of FIG. 4C following bonding of the conductive wires 410 to back sides of adjacent solar cells 402.

Referring to FIG. 3D, according to one embodiment, the conductive wires are bonded at a number of locations 311 over the P-type doped diffusion regions 304 and N-type doped diffusion regions 306. The number of bonds may depend on the cell size and the bonding technique used. For example, the conductive wires may be bonded at a few locations for soldering, in accordance with an embodiment. In another example, the conductive wires may be bonded at more than a hundred locations for laser welding, in accordance with an embodiment. In one embodiment, a continuous bond is formed. As mentioned above, in one embodiment, a metal seed layer (e.g., the metal seed layer 114 of FIGS. 1A and 1B) is disposed over the P-type doped diffusion regions 304 and N-type doped diffusion regions 306. In one such embodiment, the conductive wires 310 may be bonded to the metal seed layer. In an embodiment without a metal seed layer, the conductive wires 310 may be bonded directly to the P-type doped diffusion regions 304 and N-type doped diffusion regions 306.

A variety of bonding methods may be used, such as, for example, thermo-compression bonding, laser welding, soldering, and/or the application of a conductive adhesive. In one embodiment, bonding involves contacting the wires to the back side of one the solar cells with a roller (e.g., by pressing/applying pressure to the wires with the roller), and welding the wires in the locations 311 with a laser. In one such embodiment, the laser can emit laser beams that are transmitted through the roller while the roller applies sufficient pressure to maintain alignment and create a bond. In another embodiment, the wires 310 contact the back side of a solar cell by the application of pressure by two rollers. In one such embodiment, the two rollers are spaced sufficiently far apart to allow for laser beams to pass between the two rollers to bond the wires at the locations 311 while the two rollers apply sufficient pressure to maintain alignment and create a bond.

Figure 3E:
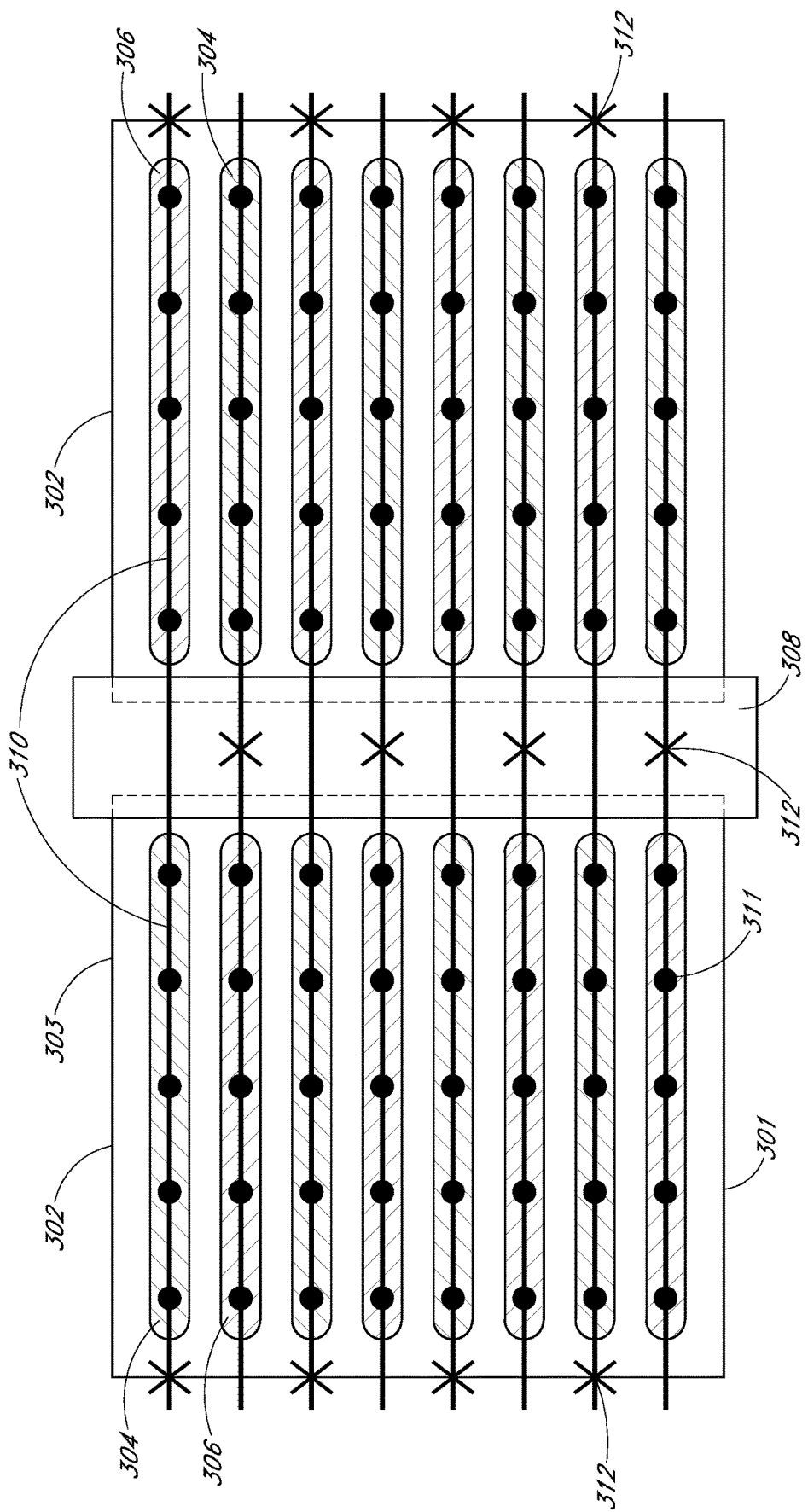
Figure 4E:
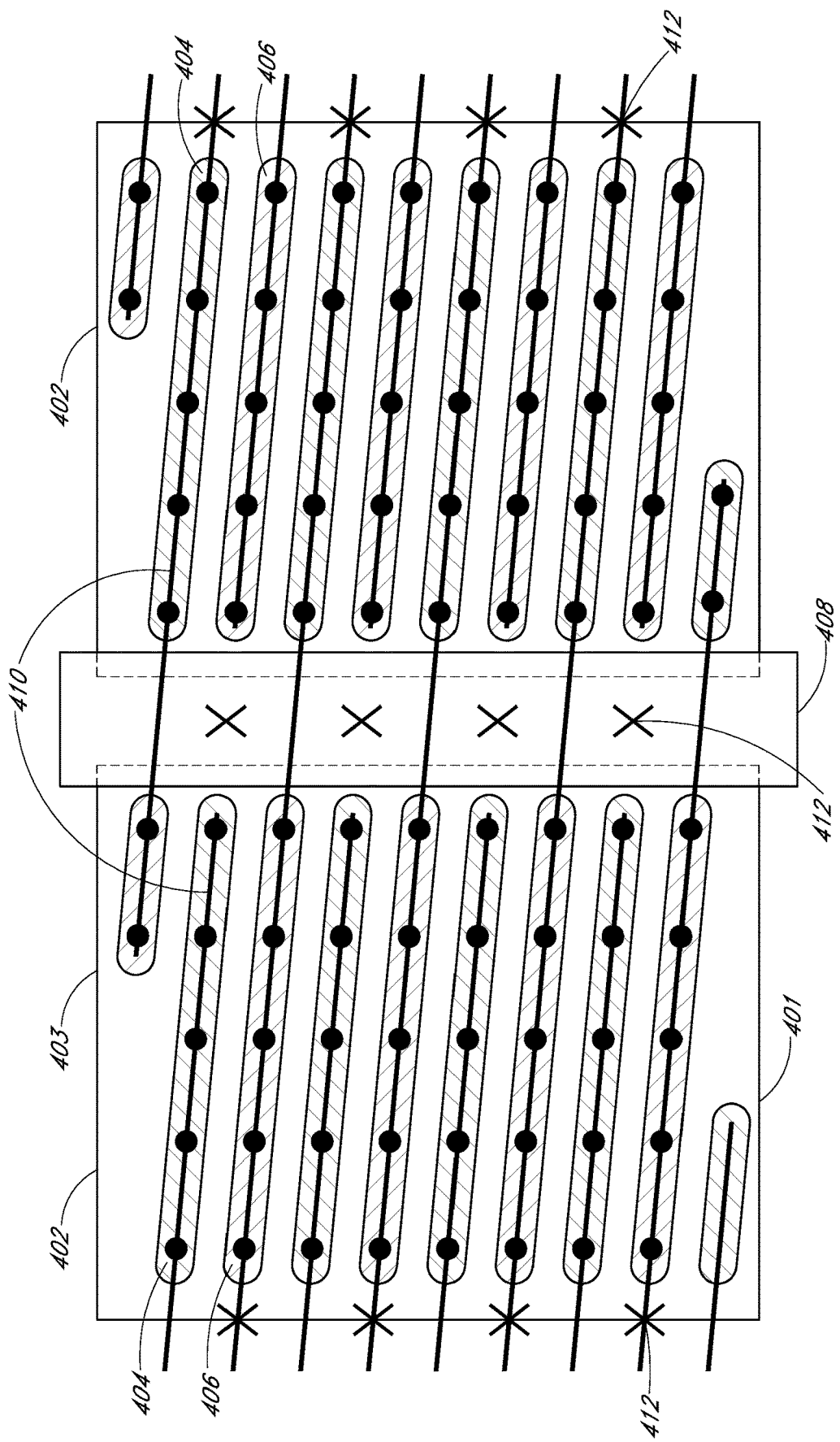

Referring to FIG. 3E and corresponding operation 206 of the flowchart 200, the method of metallization and stringing includes cutting every other one of the wires 310 between each adjacent pair of the solar cells 302. Similarly, FIG. 4E illustrates a back-side view of the adjacent solar cells 402 of FIG. 4D following the cutting of every other one of the wires 410 between the adjacent pair of solar cells 402. As illustrated in FIG. 3E, the wires 310 are cut at the locations 312, such that all of the wires connected to the P-type diffusion on one side of a solar cell 302, and all of the wires connected to the N-type diffusion of the opposite side of the solar cell are cut. Prior to cutting the wires 310 in the locations 312, the pair of solar cells are shorted. Cutting the wires 310 enables electrically coupling the solar cells for collection of current from the solar cell string. Cutting the wires 310 in the locations 312 may involve any wire cutting technique. For example the wires 310 may be cut in the locations 312 with a laser or a blade. Although the FIGS. 3A-3E and 4A-4E illustrate only two solar cells, a solar cell string can include any number of solar cells stringed together (e.g., 2 or more solar cells stringed together). The process is continuous in the sense that arbitrarily long strings of solar cells can be made.

Figure 5:
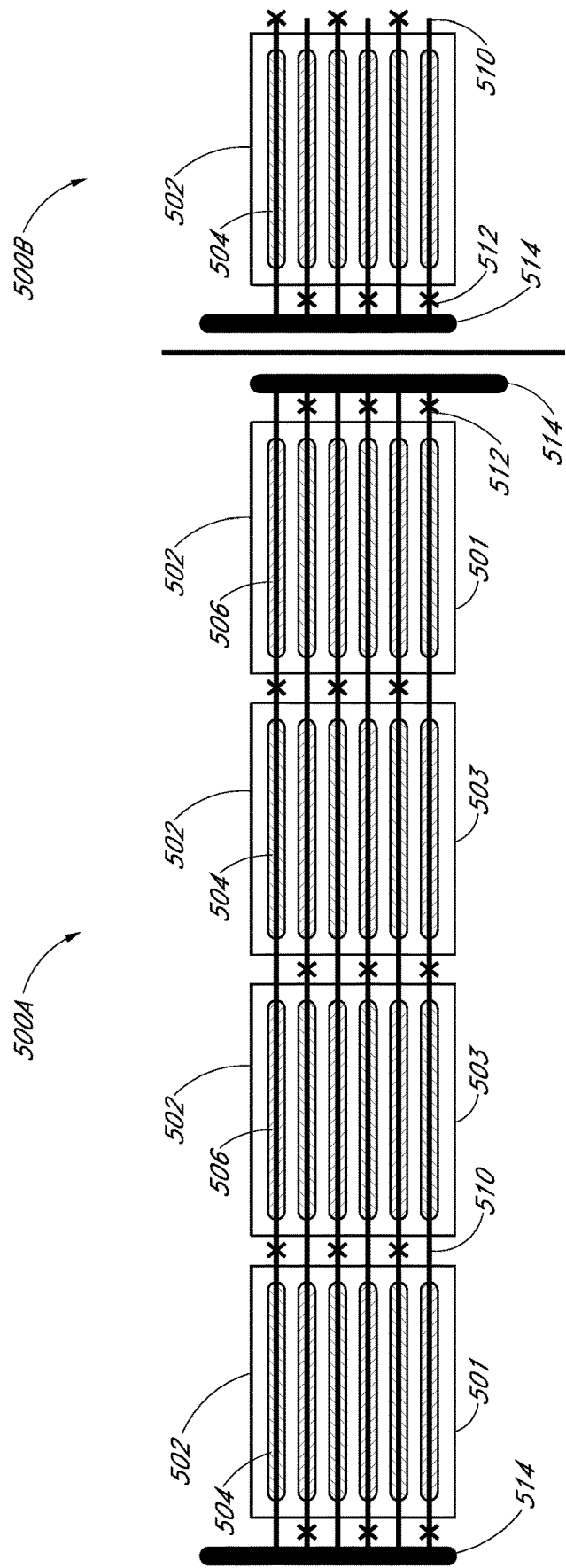
FIG. 5 illustrates a string of solar cells, in accordance with an embodiment of the present disclosure.

FIG. 5 illustrates one example of a string of solar cells, in accordance with an embodiment of the present disclosure. The solar cell string 500A illustrated in FIG. 5 includes a plurality of solar cells 502 that are electrically coupled together in series. The solar cell string 500A has two end solar cells 501, and inner solar cells 503 connected in series between the two end solar cells 501. Each of the two end solar cells 501 is electrically coupled with a busbar 514. At each of the end solar cells 501, every other one of the wires is coupled with a busbar 514 to couple only one of the two electrodes of the end solar cell, either the P-type doped diffusion regions 504 or the N-type doped diffusion regions 506. In one embodiment, the coupling of every other one of the wires from an end solar cell 501 with a busbar 514 may be achieved by first cutting all the wire at each end of the string, and connecting only the wires for either the P-type or N-type doped diffusion regions. Alternatively, all the wires for an end solar cell 501 may first be connected to a busbar 514, and then every other wire can be cut.

Only the end solar cells 501 are connected to a busbar 514, in contrast to other stringing techniques which can involve attaching busbar(s) to each solar cell, according to some embodiments. The busbars 514 may couple the solar string 500A with another solar string (e.g., such as the solar string 500B), or to another circuit (e.g., a circuit outside the module through a junction box).

As illustrated in FIG. 5, in one embodiment, a given cut section of wire is to electrically couple at most two solar cells together in series, wherein the P-type doped diffusion area of one of the two solar cells is connected to the N-type doped diffusion area of the other solar cell. However, other embodiments may include more than two solar cells being coupled together with a given cut section of wire. For example, if solar cells are connected in parallel, it is possible to connect more than two cells with a given cut section of wire. Also as illustrated in FIG. 5, in one embodiment, a cut section of wire that electrically couples an end solar cell 501 to the busbar 514 couples a single solar cell to the busbar 514. However, as mentioned above, in embodiments that connect solar cells in parallel, a given cut section of wire may connect more than a single solar cell to the busbar. Thus, a solar string can be created using the plurality of wires 510 by aligning and bonding the wires over the P-type and N-type doped diffusion regions of each of the solar cells, followed by cutting some of the wires to achieve the desired configuration of solar cells in a string.

Figure 6:
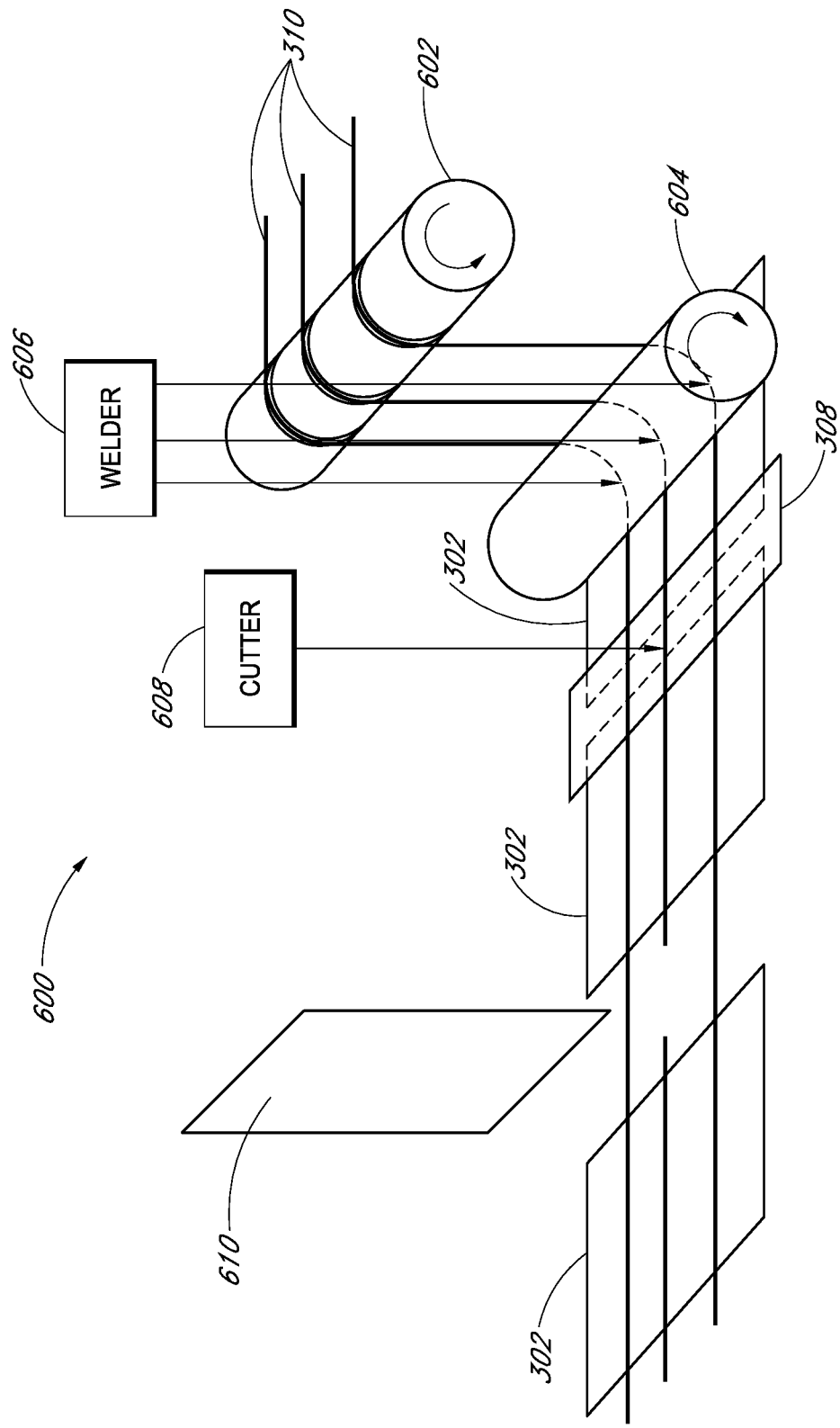
FIG. 6 illustrates a system for stringing together solar cells, in accordance with an embodiment of the present disclosure.

FIG. 6 illustrates a system for stringing together solar cells to create a solar cell string (such as the string 500A of FIG. 5), in accordance with an embodiment of the present disclosure. According to one embodiment, a system 600 for electrically coupling solar cells includes a wire support to align conductive wires substantially parallel with P-type and N-type doped diffusion regions of each of the solar cells. In the embodiment illustrated in FIG. 6, the wire support includes a grooved roller 602 to guide and support the wires 310 into the system 600, and ensure the desired alignment with the P-type and N-type doped diffusion regions. The desired alignment for the wires may be parallel with edges of the solar cells, as explained above with respect to FIGS. 3A-3E. In another embodiment, the wires are aligned at a non-zero angle relative to the edges of the solar cells. Although a grooved roller 602 is illustrated in FIG. 6, other embodiments may include other wire support and alignment mechanisms.

For example, a reed may be used to align the wires prior to bonding on the back sides of the solar cells 302. A reed includes a structure that resembles a comb, in that it has a plurality of teeth that separate slots through which the wires can pass. For example, a reed can include a slot for each of the wires, which can enable separating the wires from each other and guiding them into the desired position. Other alignment and support mechanisms capable of aligning a plurality of wires over a solar cell may also be used.

The system 600 also includes a welder 606 to bond the wires to the back side of each of the solar cells 302 over the P-type and N-type doped diffusion regions. For example, the welder 606 can form bonds at a plurality of locations, such as illustrated in FIGS. 3D and 4D. In one embodiment, the welder 606 includes a laser welder. Other welding techniques may also be used, such as, for example, thermocompression bonding, soldering, (e.g., the use of a low-melting point metal for a soldering operation), or application of a conductive adhesive. In one embodiment, one or more rollers are used to hold the wires in place during laser bonding. For example, as illustrated in FIG. 6, a roller 604 applies pressure to the wires 310 as the welder 606 bonds the wires 310 to the solar cells 302. As mentioned above, in one embodiment involving a laser welder, the roller 604 is substantially transparent to the laser beams from the laser welder. Therefore, the laser welder is positioned such that the laser beams pass through the roller 604 to bond the wires 310 to the back side of a solar cell. A transparent roller may include a quartz roller, or a roller made from another material that is substantially transparent to the laser.

In another embodiment, more than one roller 604 is used to hold the wires in place and properly aligned while the wires are bonded to the back side of a solar cell. For example, in one embodiment, two rollers are used. In one such embodiment, the two rollers are separated by enough space to enable a laser welder to form a bond between the wires and the solar cell by directing a laser beam between the two rollers. Thus, in one such embodiment, the rollers do not need to be transparent to the laser (e.g., the rollers can be opaque). In an embodiment using round wires (or wires having other shapes, which are to be flattened), the roller 604 can be used to apply sufficient pressure to flatten the wire before or during bonding. Other flattening mechanisms may be used prior to or during bonding. After the wires have been bonded to one solar cell, the alignment and bonding may be simplified by the fact that the wires are properly aligned on the preceding solar cell. For example, the wires are held in place at one end of the solar cell by the welds on the previous solar cell, and held in place at the other end of the solar cell by the roller 604 (or other support and/or alignment mechanism). Thus, in one embodiment, prior to cutting the wires on a first solar cell, the wires are aligned over and bonded to the next solar cell. In one embodiment, the wires may be bonded to the solar cells for the entire string prior to severing any of the wires, in accordance with an embodiment.

The system 600 also includes a cutter 608 to sever every other one of the wires between each adjacent pair of the solar cells, in accordance with the methods described above. The cutter 608 can include any sufficiently precise mechanism for cutting wire, such as a singulation blade or laser. The system 600 may further include a translation or conveyor mechanism to move the solar cells 302 through the system. A solar cell that has been processed by the system 600 may have features similar to the solar cell 302 of FIG. 3E and the solar cell 402 of FIG. 4E. The system may also include a second cutter 610, which is illustrated as a blade in FIG. 6. The cutter 610 may sever all the wires when the end of a solar string is reached. Some of the cut wires may then be connected to a busbar, as described above with respect to FIG. 5. Accordingly, the system 600 may be used to string together solar cells to form a solar cell string such as illustrated in FIG. 5.

Thus, methods of metallization and stringing for back-contact solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of electrically coupling solar cells, the method comprising:
    aligning conductive wires over back sides of adjacent solar cells, wherein the conductive wires are aligned substantially parallel to P-type and N-type doped diffusion regions of the solar cells, and wherein aligning the conductive wires comprises using a wire support included in a system for stringing solar cells;
    bonding the conductive wires to the back side of each of the solar cells over the P-type and N-type doped diffusion regions, wherein bonding the conductive wires comprises using a welder included in the system for stringing solar cells, the welder downstream from and vertically beneath the wire support in the system for stringing solar cells;
    subsequent to bonding the conductive wires to the backside of each of the solar cells, cutting every other one of the conductive wires between each adjacent pair of the solar cells, wherein cutting every other one of the conductive wires comprises using a first cutter included in the system for stringing solar cells, the first cutter downstream from the welder in the system for stringing solar cells; and
    subsequent to cutting every other one of the conductive wires, severing all of the conductive wires at an end of a solar string, wherein severing all of the conductive wires comprises using a second cutter included in the system for stringing solar cells, the second cutter downstream from the first cutter in the system for stringing solar cells.

2. The method of claim 1, wherein aligning the conductive wires comprises aligning the conductive wires substantially parallel to a first edge of each of the plurality of solar cells.

3. The method of claim 1, wherein aligning the conductive wires comprises aligning the conductive wires at a non-zero angle relative to edges of each of the plurality of solar cells, wherein the P-type doped diffusion regions and the N-type doped diffusion regions are at the non-zero angle relative to edges of each of the plurality of solar cells.

4. The method of claim 1, wherein cutting every other one of the conductive wires comprises cutting the conductive wires to electrically couple at most two solar cells together in series with a given cut section of wire, wherein the given cut section of wire is to connect the P-type doped diffusion regions of one of the two solar cells to the N-type doped diffusion regions of the other of the two solar cells.

5. The method of claim 1, wherein the electrically coupled solar cells form a string of solar cells, the method further comprising:
    electrically coupling a conductive busbar with each wire bonded to an end solar cell of the string;
    cutting every other one of the conductive wires between the conductive busbar and the end solar cell; and
    electrically coupling the conductive busbar with another string of solar cells.

6. The method of claim 5, wherein cutting every other one of the conductive wires between the conductive busbar and the end solar cell comprises electrically coupling a single solar cell of the string of solar cells with the conductive busbar.

7. The method of claim 1, further comprising attaching a non-conductive shield to back sides of the solar cells between each adjacent pair of the solar cells, hiding exposed sections of the conductive wires when viewed from front sides of the solar cells.

8. The method of claim 1, wherein cutting the every other one of the conductive wires between each adjacent pair of the solar cells comprises cutting the every other one of the conductive wires with a laser or blade.

* * * * *